(12) United States Patent
Kabir et al.

(10) Patent No.: US 12,266,729 B2
(45) Date of Patent: Apr. 1, 2025

(54) ANGLED ETCH TO ENABLE TIN REMOVAL FROM SELECTED SIDEWALLS

(71) Applicant: Intel Corporation, Santa Clara, CA (US)

(72) Inventors: Nafees A. Kabir, Portland, OR (US); Shriram Shivaraman, Hillsboro, OR (US); Seung Hoon Sung, Portland, OR (US); Uygar E. Avci, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 650 days.

(21) Appl. No.: 17/485,162

(22) Filed: Sep. 24, 2021

(65) Prior Publication Data

US 2023/0102900 A1    Mar. 30, 2023

(51) Int. Cl.
*H01L 21/4763* (2006.01)
*H01L 29/66* (2006.01)
*H01L 29/78* (2006.01)
*H01L 29/786* (2006.01)

(52) U.S. Cl.
CPC .... *H01L 29/7869* (2013.01); *H01L 21/47635* (2013.01); *H01L 29/66969* (2013.01); *H01L 29/785* (2013.01)

(58) Field of Classification Search
CPC .......... H01L 21/47635; H01L 21/4763; H01L 21/02365; H01L 21/32136; H01L 29/7869; H01L 29/786; H01L 29/66969; H01L 29/66; H01L 29/785; H01L 29/78; H01L 29/1054; H01L 29/10; H01L 29/66795; H10B 51/30; H10B 51/20; H10B 51/40; H10B 51/00

See application file for complete search history.

(56) References Cited

U.S. PATENT DOCUMENTS 10,566,201 B1 * 2/2020 Park ................... H01L 21/28123
2018/0096932 A1 * 4/2018 Xie .................... H01L 21/76816

* cited by examiner

*Primary Examiner* — Nikolay K Yushin
(74) *Attorney, Agent, or Firm* — Schwabe, Williamson & Wyatt P.C.

(57) ABSTRACT

A method of fabricating an integrated circuit structure comprises depositing an oxide insulator layer over a substrate having fins. A gate trench is formed within the oxide insulator layer with the fins extending above a surface of the oxide insulator layer within the gate trench. A semiconducting oxide material is deposited to conformally cover the oxide insulator layer, including on top surfaces and sidewalls of both the gate trench and the fins. A gate material is deposited to conformally cover the semiconducting oxide material, including on top surfaces and sidewalls of both the gate trench and the fins. An angled etch is performed to remove the gate material selective to the semiconducting oxide material from sidewalls of the gate trench, but not from sidewalls of the fins.

20 Claims, 10 Drawing Sheets

ANGLED ETCH TO ENABLE TiN REMOVAL FROM SELECTED SIDEWALLS

TECHNICAL FIELD

Embodiments of the disclosure are in the field of integrated circuits and, in particular, the methods and systems for an angled etch to enable TiN removal from selected sidewalls.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant.

Variability in conventional and state-of-the-art fabrication processes may limit the possibility to further extend them into the sub-10 nm range. Consequently, fabrication of the functional components needed for future technology nodes may require the introduction of new methodologies or the integration of new technologies in current fabrication processes or in place of current fabrication processes.

DESCRIPTION OF THE EMBODIMENTS

An angled etch to enable TiN removal from selected sidewalls are described. In the following description, numerous specific details are set forth, such as specific material and tooling regimes, in order to provide a thorough understanding of embodiments of the present disclosure. It will be apparent to one skilled in the art that embodiments of the present disclosure may be practiced without these specific details. In other instances, well-known features, such as single or dual damascene processing, are not described in detail in order to not unnecessarily obscure embodiments of the present disclosure. Furthermore, it is to be understood that the various embodiments shown in the Figures are illustrative representations and are not necessarily drawn to scale. In some cases, various operations will be described as multiple discrete operations, in turn, in a manner that is most helpful in understanding the present disclosure, however, the order of description should not be construed to imply that these operations are necessarily order dependent. In particular, these operations need not be performed in the order of presentation.

Certain terminology may also be used in the following description for the purpose of reference only, and thus are not intended to be limiting. For example, terms such as "upper", "lower", "above", "below," "bottom," and "top" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Embodiments described herein may be directed to front-end-of-line (FEOL) semiconductor processing and structures. FEOL is the first portion of integrated circuit (IC) fabrication where the individual devices (e.g., transistors, capacitors, resistors, etc.) are patterned in the semiconductor substrate or layer. FEOL generally covers everything up to (but not including) the deposition of metal interconnect layers. Following the last FEOL operation, the result is typically a wafer with isolated transistors (e.g., without any wires).

Embodiments described herein may be directed to back-end-of-line (BEOL) semiconductor processing and structures. BEOL is the second portion of IC fabrication where the individual devices (e.g., transistors, capacitors, resistors, etc.) are interconnected with wiring on the wafer, e.g., the metallization layer or layers. BEOL includes contacts, insulating layers (dielectrics), metal levels, and bonding sites for chip-to-package connections. In the BEOL part of the fabrication stage contacts (pads), interconnect wires, vias and dielectric structures are formed. For modern IC processes, more than 10 metal layers may be added in the BEOL.

Embodiments described below may be applicable to FEOL processing and structures, BEOL processing and structures, or both FEOL and BEOL processing and structures. In particular, although an exemplary processing scheme may be illustrated using a FEOL processing scenario, such approaches may also be applicable to BEOL processing. Likewise, although an exemplary processing scheme may be illustrated using a BEOL processing scenario, such approaches may also be applicable to FEOL processing.

To continue the pace of improvements in microelectronic performance, computer memory needs to be scalable to smaller sizes. Ferroelectric memories, particularly memory architectures using new thin FE materials, provide a promising memory option for the future.

One or more embodiments described herein are directed to structures and architectures for fabricating an integrated circuit, such as ferroelectric memory, using an angled spacer etch to enable removal of a TiN gate material from selected sidewalls of a non-planar transistor. Embodiments may include or pertain to one or more of memory or ferroelectric memory (e.g., ferroelectric DRAM (FeRAM)), and selective angled etch techniques.

Figure 1A:
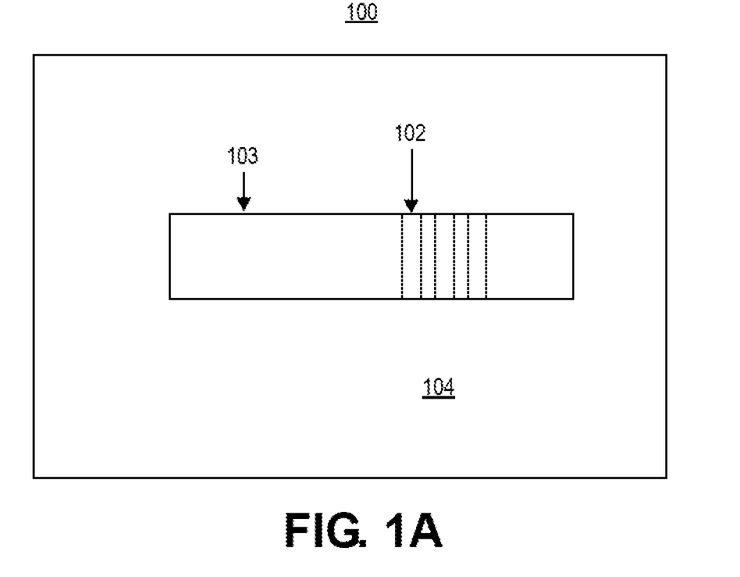
FIGS. 1A-1C illustrate a non-planar integrated circuit (IC) structure during fabrication.
Figure 1B:
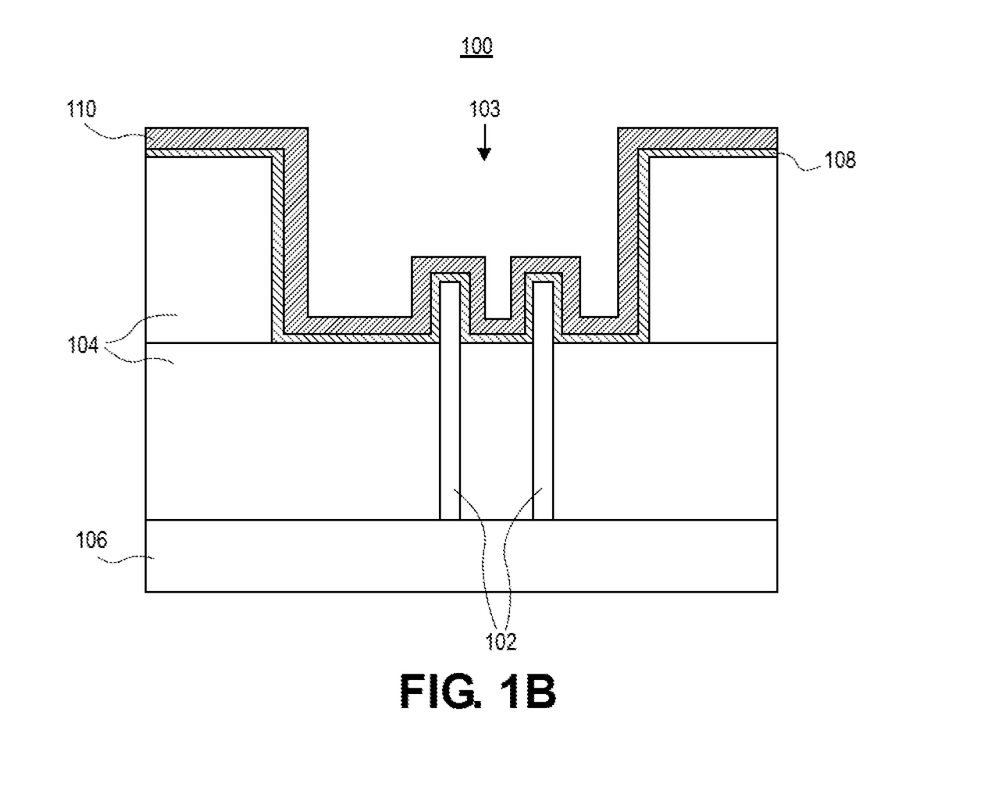
Figure 1C:
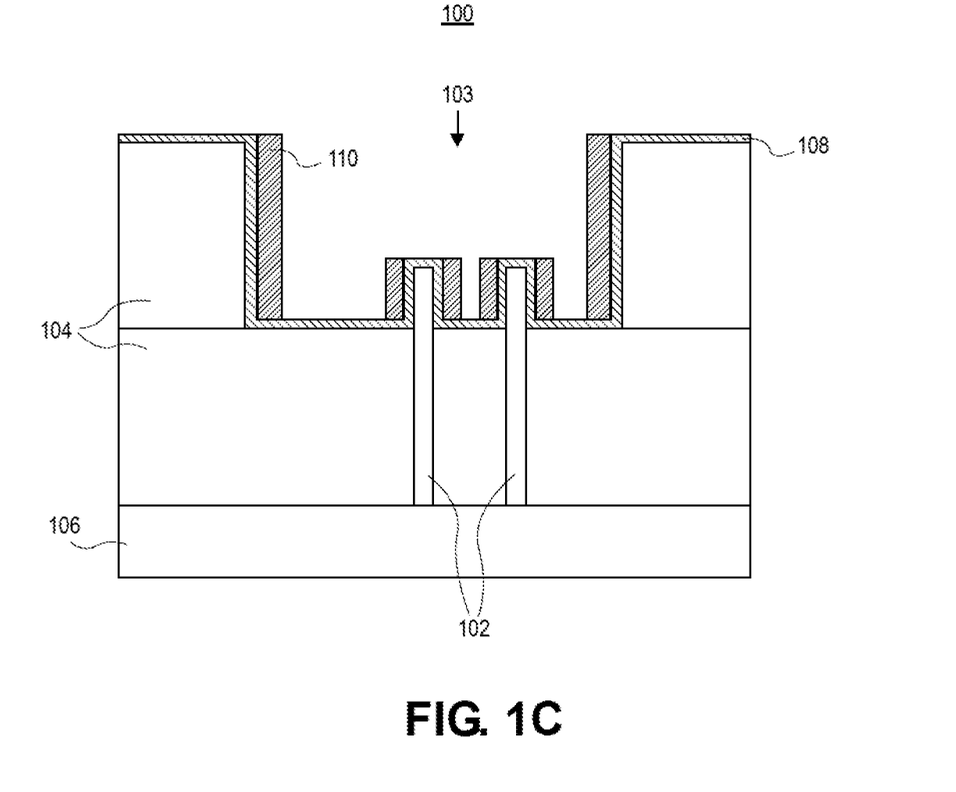

To provide context, FIGS. 1A-1C illustrate a non-planar integrated circuit (IC) structure 100 during fabrication. FIG. 1A illustrates a top view of a fin-type transistor topography of the non-planar IC structure 100. FIG. 1B illustrates a cross-sectional view of the IC structure 100 taken along a gate "width" of the fin-type transistor topography.

Referring to FIG. 1A, the non-planar IC structure 100 comprises an oxide insulator layer 104 above a substrate 106 (hidden beneath the insulator layer 104), and a gate trench 103 formed in the insulator layer 106. Within the gate trench 103 is a plurality of one or more silicon fins 102.

FIG. 1B shows the oxide insulator layer 104 over the substrate 106, and the fins 102 extending above the oxide insulator layer 104 within the gate trench 103. The fins 102 have a top and sidewalls. A semiconducting oxide material 108, or similarly suitable channel material, conformally covers the oxide insulator layer 104, including on the top and sidewalls of both the gate trench 103 and the fins 102. The semiconducting oxide material 108 may comprise a ferroelectric material such as hafnium oxide (HfO or HfO2). A gate material 110 conformally covers the semiconducting oxide material 108, including on the top and sidewalls of both the gate trench 103 and the fins 102. The gate material 110 may comprise titanium nitride (TiN) or polysilicon. In subsequent fabrication steps, the gate material 110 may be replaced with another metal gate material.

During a subsequent fabrication step, a traditional spacer etch may be used to remove the gate material 110 for the top horizontal surfaces of the semiconducting oxide material 108 over insulator layer 104 and the fins 102, as shown in FIG. 1C. After the spacer etch, the semiconducting oxide material 108 remains on both the horizontal and vertical surfaces of the oxide insulator layer 104, and the gate material 110 remains along vertical sidewalls of the gate trench 103.

However, there is a recently recognized need for an improved etching scheme to remove the TiN gate material 110 selective to semiconducting oxide material 108 from selected sidewalls of the gate trench 103 even though both vertical and horizontal surfaces are exposed.

Figure 2:
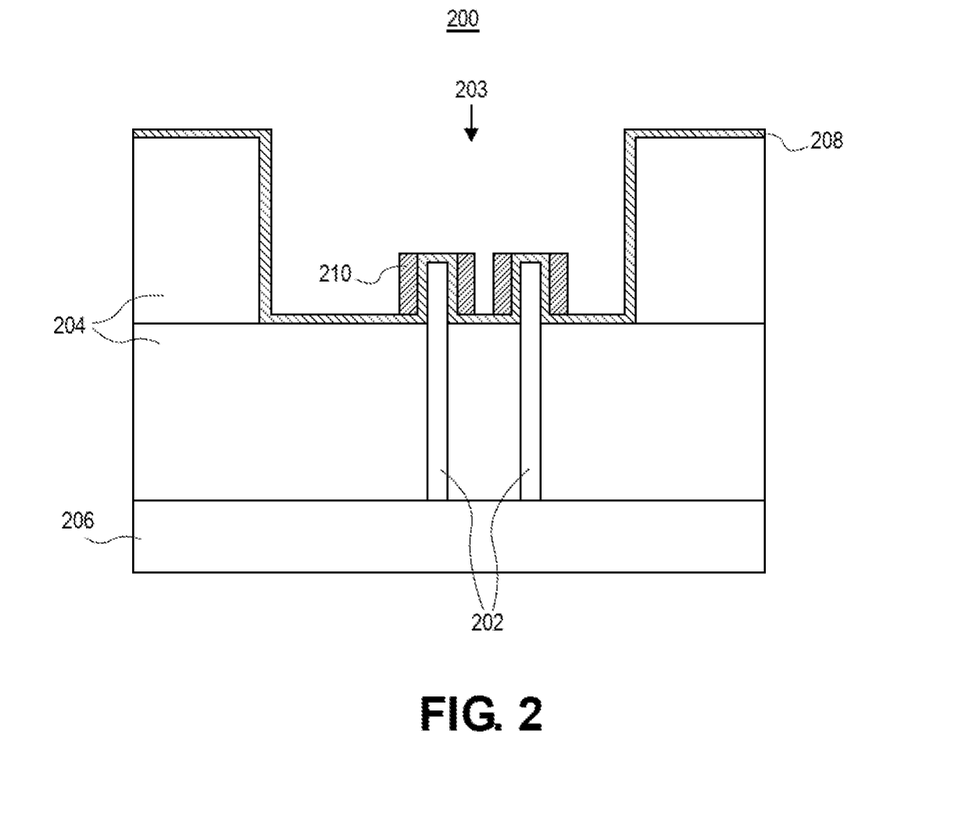
FIG. 2 illustrates a non-planar integrated circuit (IC) structure after the angle etch process of the disclosed embodiments.

In accordance with one or more embodiments of the present disclosure, the TiN gate material 110 is removed from selected sidewalls of the gate trench 103, while remaining on sidewalls of fins, using an angled etching process, as shown in FIG. 2.

FIG. 2 illustrates a non-planar integrated circuit (IC) structure 200 after the angle etch process of the disclosed embodiments. Incoming to the etch process is the IC structure 100 (FIG. 1B), which may be suitable for a memory or ferroelectric memory transistor architecture. Similar to FIG. 1B, the IC structure 200 includes an oxide insulator layer 204 over a substrate 206, and a fins 202 extending above the oxide insulator layer 204 within a gate trench 203. The fins 202 have a top and sidewalls, and may have a pitch of approximately 40-90 nm and may be approximately 14 nm in width in one example. A semiconducting oxide material 208, or similarly suitable channel material, conformally covers the oxide insulator layer 204, including on the top and sidewalls of both the gate trench 203 and the fins 202.

The semiconducting oxide material 208 may include, for example, materials exhibiting ferroelectric behavior at thin dimensions, such as hafnium oxide (HfO or HfO$_2$). A gate material 210, such as titanium nitride (TiN) or polysilicon, covers the sidewalls of the fins 202.

In some embodiments, the semiconducting oxide material 208 may be approximately 1 nm in thickness on the horizontal and vertical surfaces of both oxide insulator layer 204 and the fins 202. The TiN gate material 210 may be approximately 5 nm in thickness on the horizontal and vertical surfaces of both oxide insulator layer 204 and the fins 202.

In other embodiments, the semiconducting oxide material 208 may comprise other materials such as hafnium zirconium oxide (HfZrO), also referred to as HZO, which includes hafnium, zirconium, and oxygen), silicon-doped (Si-doped) hafnium oxide (which is a material that includes hafnium, oxygen, and silicon), germanium-doped (Ge-doped) hafnium oxide (which is a material that includes hafnium, oxygen, and germanium), aluminum-doped (Al-doped) hafnium oxide (which is a material that includes hafnium, oxygen, and aluminum), yttrium-doped (Y-doped) hafnium oxide (which is a material that includes hafnium, oxygen, and yttrium). The semiconducting oxide material 208 may be formed by conventional techniques, such as, for example, chemical vapor deposition (CVD), physical vapor deposition (PVD), or by other deposition methods.

In one embodiment, the oxide insulator layer 204 may comprise silicon oxide, or a low-k dielectric, e.g., silicon dioxide, carbon doped oxide ("CDO"), or any combination thereof. In one embodiment, the oxide insulator layer 204 may include a nitride, oxide, a polymer, phosphosilicate glass, fluorosilicate ("SiOF") glass, organosilicate glass ("SiOCH"), or any combination thereof. In another embodiment, the oxide insulator layer 204 may comprise a nitride layer, e.g., silicon nitride layer. In alternative embodiments, the oxide insulator layer 204 may be on another layer of aluminum oxide, silicon oxide nitride, other oxide/nitride layer, any combination thereof, or other electrically insulating layer determined by an electronic device design.

Substrate 206 may be composed of a material suitable for semiconductor device fabrication. In one embodiment, the structure is formed using a bulk semiconductor substrate. Substrate 206 may include, but is not limited to, silicon, germanium, silicon-germanium, or a III-V compound semiconductor material. In another embodiment, the substrate 206 is a silicon-on-insulator (SOI) substrate. An SOI substrate includes a lower bulk substrate, a middle insulator layer disposed on the lower bulk substrate, and a top monocrystalline layer. The middle insulator layer may comprise silicon dioxide, silicon nitride, or silicon oxynitride. The top single crystalline layer may be any suitable semiconductor material, such as those listed above for a bulk substrate.

According to embodiments, a lateral reactive ion etch (RIE) chamber is used to perform an angled etch to remove the TiN gate material 210 selective to thin semiconducting oxide material 208 from selected sidewalls of gate trench 203 even though both vertical and horizontal surfaces are exposed. The lateral RIE chamber generates a "directional" ion-beam controlled by a selection of a choice of chemistries to remove the TiN gate material 210 selective to thin semiconducting oxide material 208. As a result, the TiN gate material 210 remains intact on vertical sidewalls of fins 202, but not on the vertical sidewalls of the gate trench 203 or on any horizontal surfaces, including top surfaces of the semiconducting oxide material 208 over the fins 202.

In one embodiment, the lateral RIE chamber may comprise a dry etch cluster tool having ribbon beam technology from Applied Materials™. The tool injects ions in the form of a ribbon beam that falls on a wafer as the wafer is moved up and down. According to the disclosed embodiments, etch selectivity is achieved by using a halogen gas, such as chlorine in the lateral RIE chamber. For example, the gas may comprise chlorine and argon, such as Cl2/Ar. The "directional" component of the ribbon beam is selected by choice of four major parameters of the lateral RIE chamber. Those parameters are: a) the choice of optics (bi-directional, unidirectional etc., b) distance between the wafer and the beam (known as z-gap), and c) choice of gases/chemistries and d) extraction voltage (measured in kV and dictates at what energy the ion-beam is hitting the reaction surface).

Figure 3:
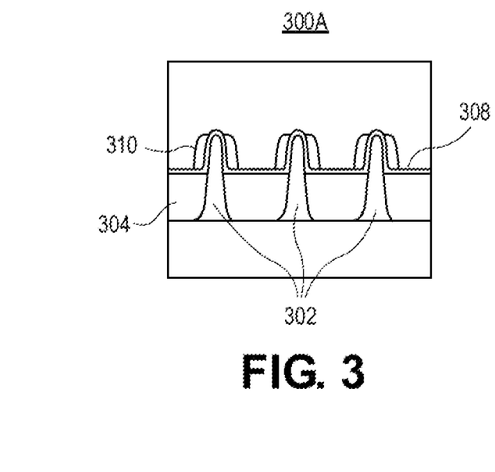
FIG. 3 illustrates a transmission electron Microscopy (TEM) images of an IC structure fabricated using an angled spacer etch.

FIG. 3 illustrates a transmission electron microscopy (TEM) fin cut image of an IC structure fabricated using an angled spacer etch. FIG. 3 shows the IC structure 300A with fins 302 extending above an oxide insulator layer 304, and semiconducting oxide material 308 conformally covers the oxide insulator layer 304, including on the top and sidewalls of the fins 302. In this embodiment, the semiconducting oxide material 308 comprises hafnium oxide and the gate material 310 comprises TiN. After the angled etch, a gate material 310 remains on vertical surfaces of semiconducting oxide material 308 along the fins 302, but not on the horizontal surfaces of the semiconducting oxide material 308.

Figure 4A:
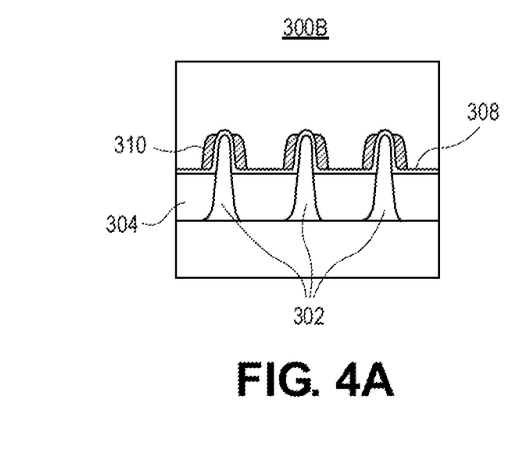
FIG. 4A-4C illustrate transmission electron Microscopy (TEM) images with EDX material analysis of an IC structure fabricated using an angled spacer etch.
Figure 4B:
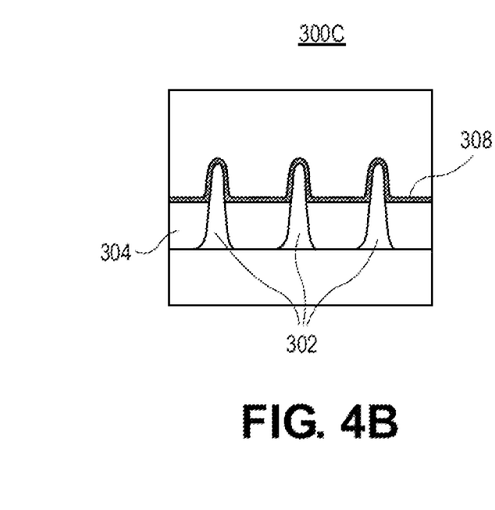
Figure 4C:
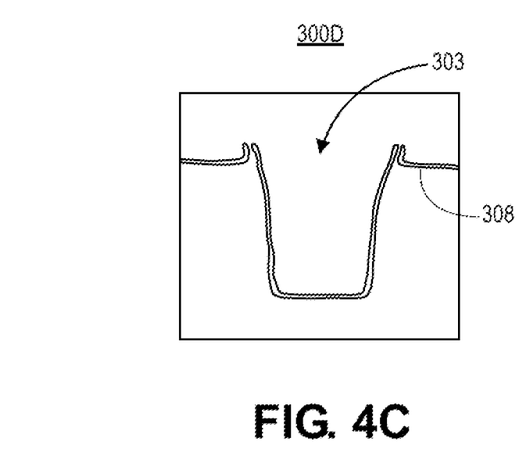

FIGS. 4A-4C illustrate TEM fin cut images with EDX material analysis of the IC structure fabricated using an angled spacer etch. FIG. 4A shows an EDX material analysis Ti and N in the IC structure 300B to illustrate the presence of the TiN gate material 310 after the angled etch removes the TiN selective to the underlying hafnium oxide comprising the semiconducting oxide material 308. As shown, the TiN gate material 310 remains along the vertical sidewalls of the fins 302, but not any other horizontal or vertical surface.

FIG. 4B shows an EDX material analysis of hafnium oxide in the IC structure 300C to illustrate the presence of the hafnium oxide comprising the semiconducting oxide material 308 across fins 302. After the angled etch, the hafnium oxide remains substantially intact. That is, the hafnium oxide semiconducting oxide material 308 may have some missing portions along horizontal surfaces of the top of the fins 302, but majority of the hafnium oxide remains along the sidewalls the fins 302 based on process optimization to make sure the HfOx remains intact.

FIG. 4C illustrates an EDX material analysis of the IC structure 300D across the entire gate trench 303. As shown, after the angled etch, the hafnium oxide semiconducting oxide material 308 remains across tops and sides of the gate trench 303.

According to the disclosed embodiments, after the angled etch process is performed approximately 90-100% of the hafnium oxide semiconducting oxide material 308 remains, and approximately 60-80% of the TiN gate material 310 remains. For example, if the TiN gate material 310 is originally deposited to a depth of approximately 5 nm, after the angled etch approximately 3-4 nm of the TiN gate material 310 remains along the sidewalls of the fins 302.

Figure 5A:
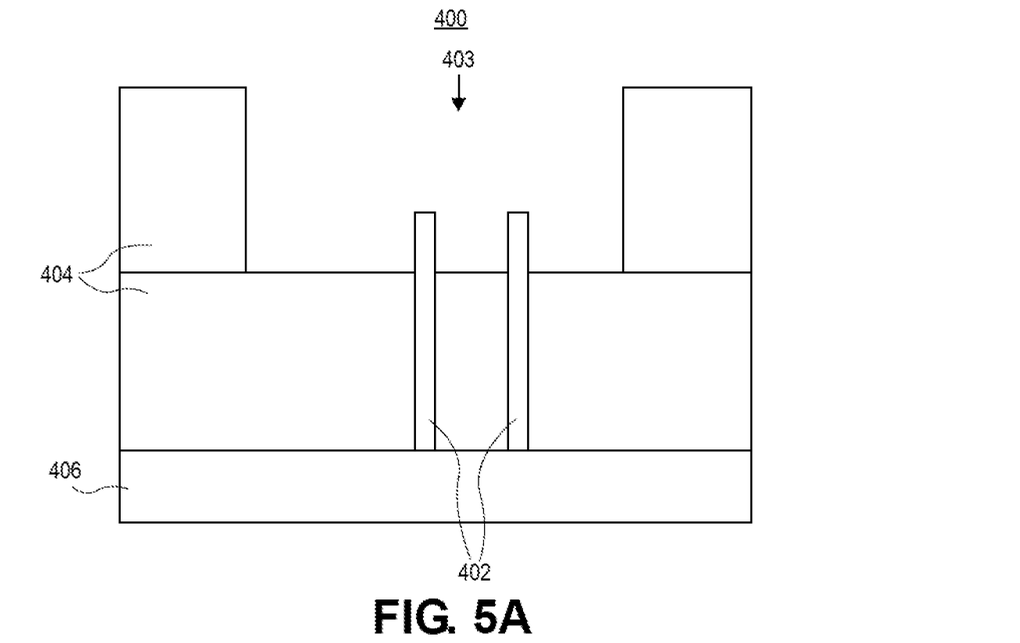
FIGS. 5A-5D illustrates cross-sectional views of a process for fabricating a non-planar integrated circuit (IC) structure using an angled etch.

FIGS. 5A-5D illustrates cross-sectional views of a process for fabricating a non-planar integrated circuit (IC) structure 400 using an angled etch. FIG. 5A illustrates that after an oxide insulator layer 404 is deposited over a substrate 406 having a plurality of fins 402, a gate trench 403 is formed within the oxide insulator layer 404 with fins 402 extending above a surface of the oxide insulator layer 404 within a gate trench 403. The fins 402 have a top and sidewalls, and may have a width of approximately 14 nm and a pitch of the approximately 40-90 nm in one example.

Figure 5B:
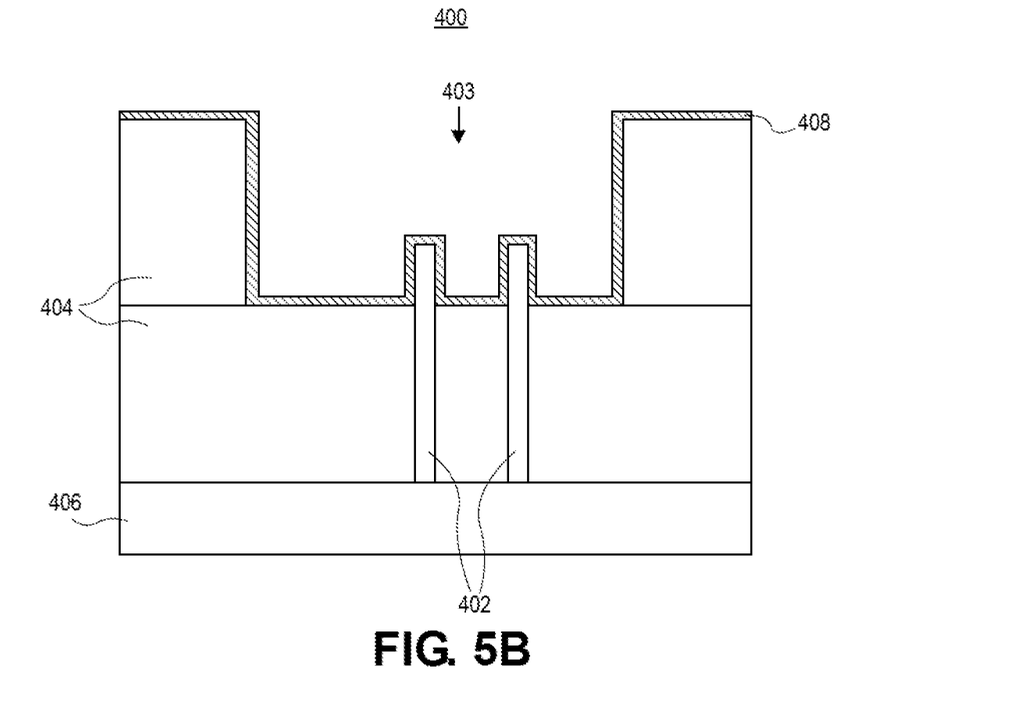

FIG. 5B illustrates the fabrication process after a semiconducting oxide material 408, or similarly suitable channel material, is deposited to conformally cover the oxide insulator layer 404, including on top surfaces and sidewalls of both the gate trench 403 and the fins 402.

Figure 5C:
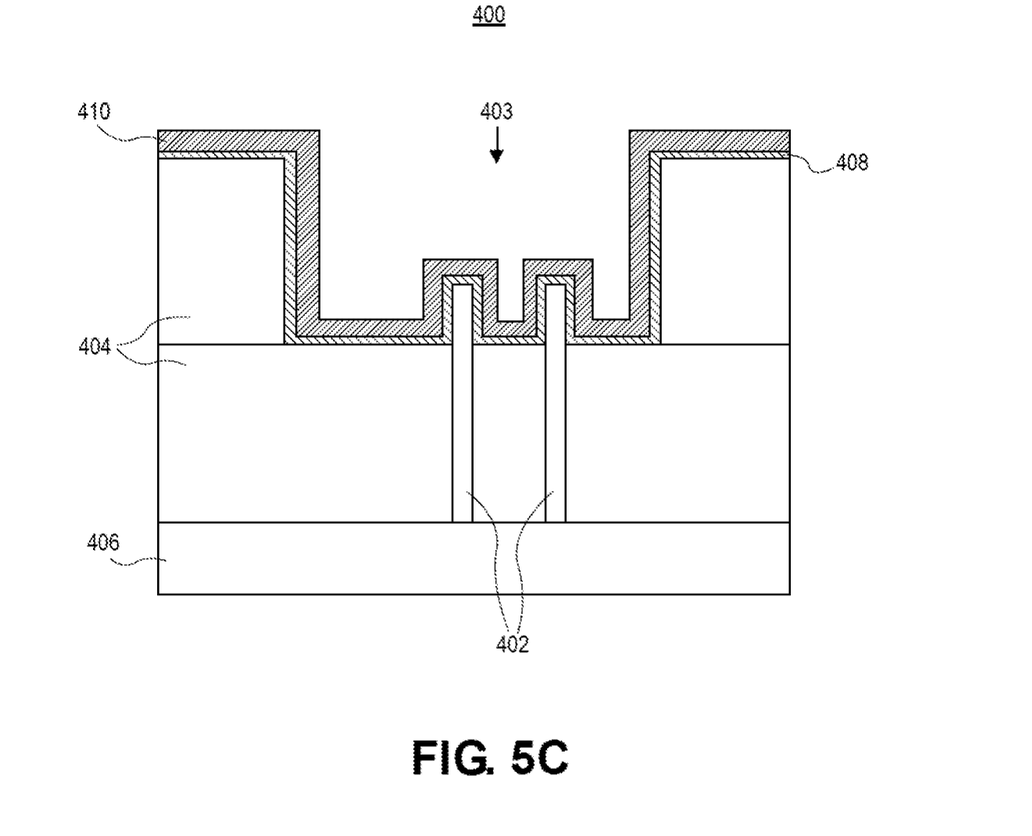

FIG. 5C illustrates the fabrication process after a gate material 410, such as titanium nitride (TiN) is deposited to conformally cover the semiconducting oxide material 408, including on the top and sidewalls of both the gate trench 403 and the fins 402. The thickness of the gate material 410 depends on the application and process.

Figure 5D:
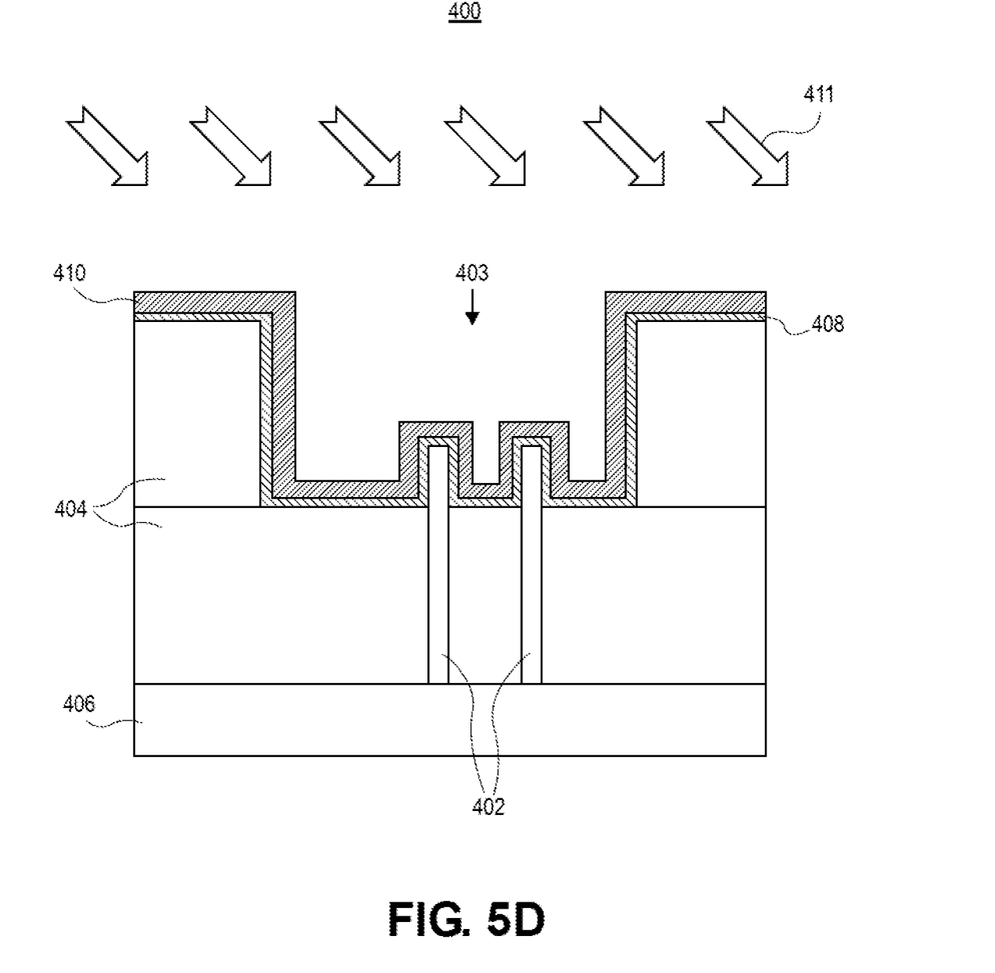

FIG. 5D illustrates an angled etch 411 of the disclosed embodiments is performed on the non-planar IC structure 400 to remove the gate material 410 from sidewalls of the gate trench 403, but not from sidewalls of the fins 402. As shown in FIG. 2, after the angled etch 411, the gate material 210 is removed from all horizontal surfaces and from vertical walls of the gate trench 203, but remains on the sidewalls of the fins 202.

In one aspect, the gate material 410 may be fabricated by a replacement gate process. In such a scheme, the gate material 410 such as TiN, polysilicon or silicon nitride pillar material, may be a dummy gate that is removed and replaced with permanent gate electrode material. In an embodiment, the dummy gate may be removed by a dry etch or wet etch process.

The integrated circuit structures described herein may be included in an electronic device. As an example of one such apparatus, FIGS. 6A and 6B are top views of a wafer and dies that include one or more non-planar transistors having a gate material removed from selected sidewalls in a gate trench, in accordance with one or more of the embodiments disclosed herein.

Figure 6A:
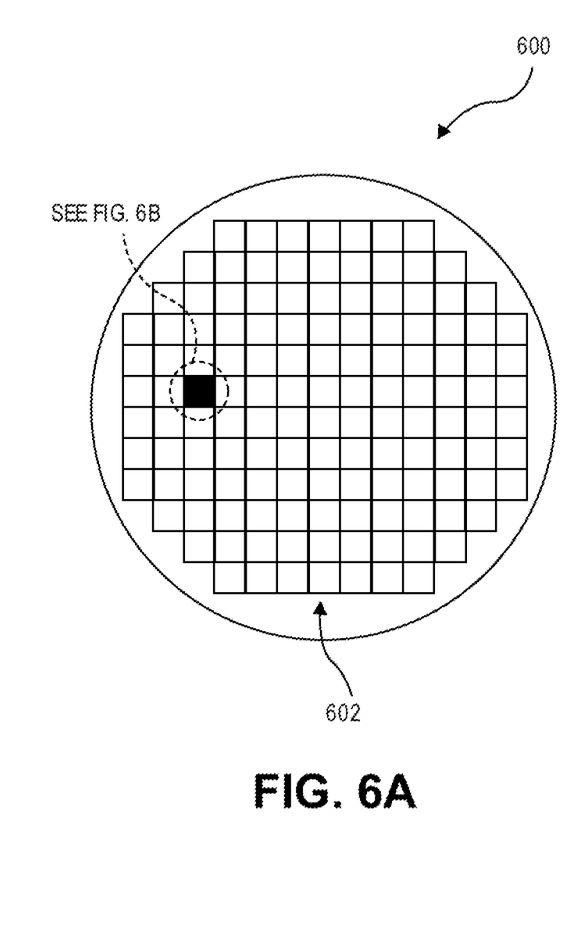
FIGS. 6A and 6B are top views of a wafer and dies that include one or more non-planar transistors having a gate material removed from selected sidewalls in a gate trench, in accordance with one or more of the embodiments disclosed herein.
Figure 6B:
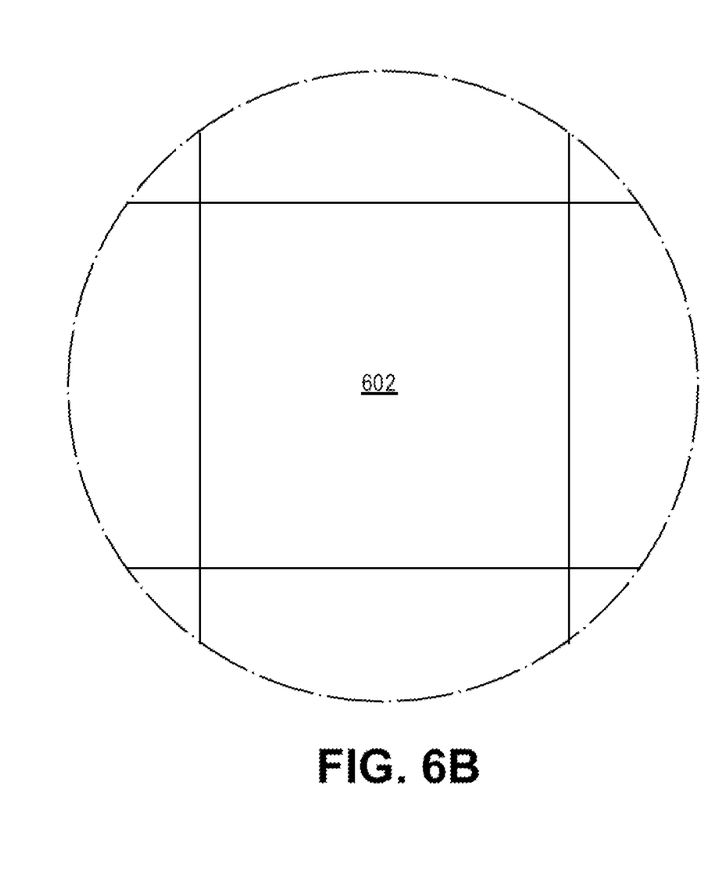

Referring to FIGS. 6A and 6B, a wafer 600 may be composed of semiconductor material and may include one or more dies 602 having integrated circuit (IC) structures formed on a surface of the wafer 600. Each of the dies 602 may be a repeating unit of a semiconductor product that includes any suitable IC (e.g., ICs including one or more non-planar transistors having a gate material removed from selected sidewalls in a gate trench), such as described above. After the fabrication of the semiconductor product is complete, the wafer 600 may undergo a singulation process in which each of the dies 602 is separated from one another to provide discrete "chips" of the semiconductor product. In particular, structures that include embedded non-volatile memory structures having an independently scaled selector as disclosed herein may take the form of the wafer 600 (e.g., not singulated) or the form of the die 602 (e.g., singulated). The die 602 may include one or more embedded non-volatile memory structures based independently scaled selectors and/or supporting circuitry to route electrical signals, as well as any other IC components. In some embodiments, the wafer 600 or the die 602 may include an additional memory device (e.g., a static random access memory (SRAM) device), a logic device (e.g., an AND, OR, NAND, or NOR gate), or any other suitable circuit element. Multiple ones of these devices may be combined on a single die 602. For example, a memory array formed by multiple memory devices may be formed on a same die 602 as a processing device or other logic that is configured to store information in the memory devices or execute instructions stored in the memory array.

Embodiments disclosed herein may be used to manufacture a wide variety of different types of integrated circuits and/or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 7:
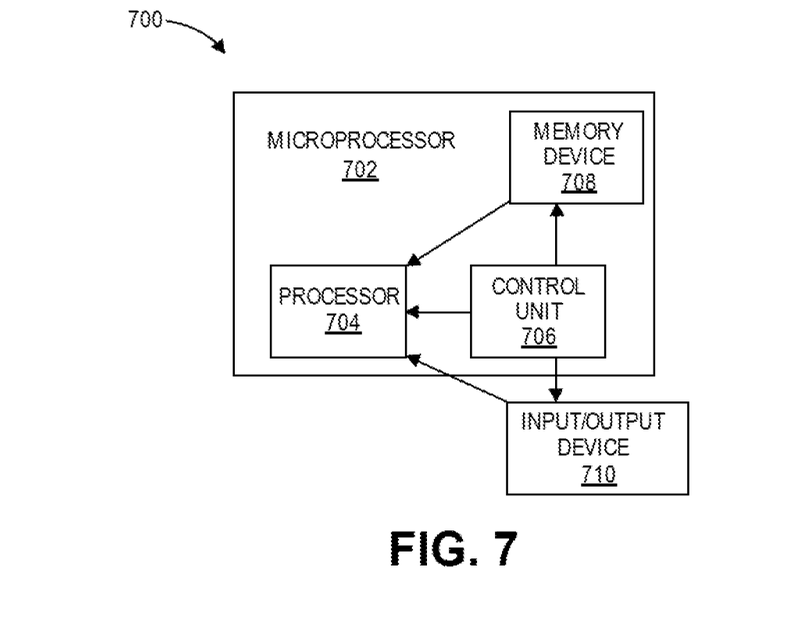
FIG. 7 illustrates a block diagram of an electronic system, in accordance with an embodiment of the present disclosure.

FIG. 7 illustrates a block diagram of an electronic system 700, in accordance with an embodiment of the present disclosure. The electronic system 700 can correspond to, for example, a portable system, a computer system, a process control system, or any other system that utilizes a processor and an associated memory. The electronic system 700 may include a microprocessor 702 (having a processor 704 and control unit 706), a memory device 708, and an input/output device 710 (it is to be appreciated that the electronic system 700 may have a plurality of processors, control units, memory device units and/or input/output devices in various embodiments). In one embodiment, the electronic system 700 has a set of instructions that define operations which are to be performed on data by the processor 704, as well as, other transactions between the processor 704, the memory device 708, and the input/output device 710. The control unit 706 coordinates the operations of the processor 704, the memory device 708 and the input/output device 710 by cycling through a set of operations that cause instructions to be retrieved from the memory device 708 and executed. The memory device 708 can include a non-volatile memory cell as described in the present description. In an embodiment, the memory device 708 is embedded in the microprocessor 702, as depicted in FIG. 7. In an embodiment, the processor 704, or another component of electronic system 700, includes one or more non-planar transistors having a gate material removed from selected sidewalls in a gate trench, such as those described herein.

Figure 8:
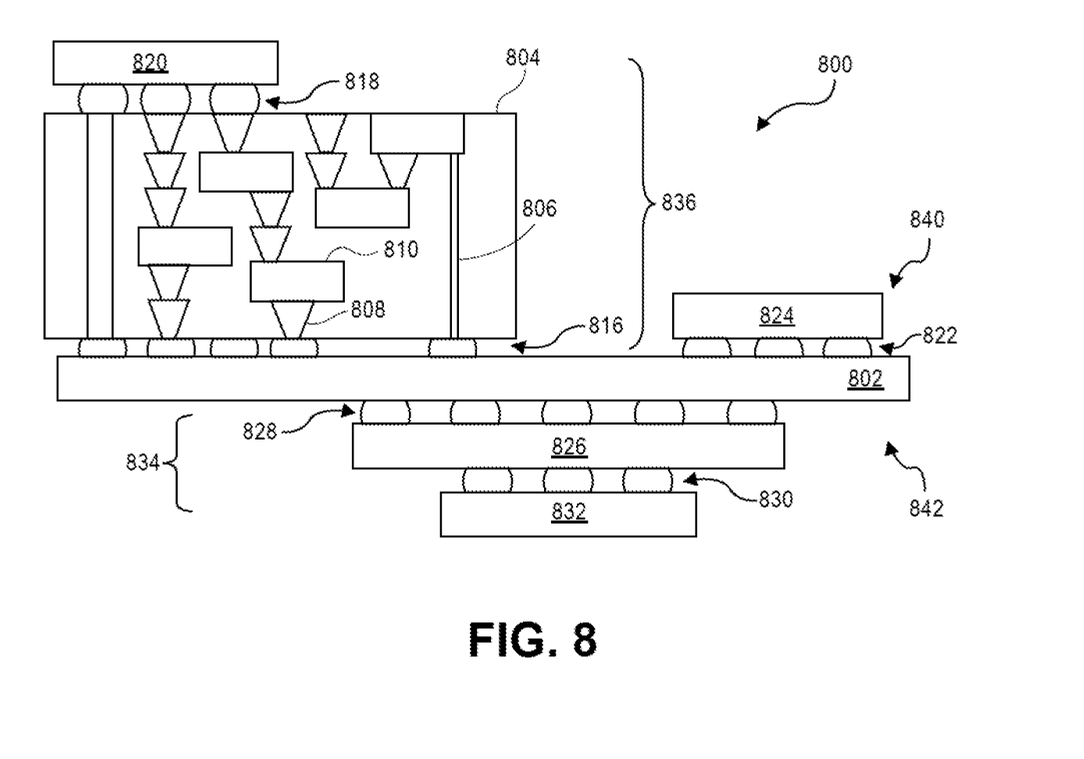
FIG. 8 is a cross-sectional side view of an integrated circuit (IC) device assembly that may include one or more non-planar transistors having a gate material removed from selected sidewalls in a gate trench, in accordance with one or more of the embodiments disclosed herein.

FIG. 8 is a cross-sectional side view of an integrated circuit (IC) device assembly that may include one or more non-planar transistors having a gate material removed from selected sidewalls in a gate trench, in accordance with one or more of the embodiments disclosed herein.

Referring to FIG. 8, an IC device assembly 800 includes components having one or more integrated circuit structures described herein. The IC device assembly 800 includes a number of components disposed on a circuit board 802 (which may be, e.g., a motherboard). The IC device assembly 800 includes components disposed on a first face 840 of the circuit board 802 and an opposing second face 842 of the circuit board 802. Generally, components may be disposed on one or both faces 840 and 842. In particular, any suitable ones of the components of the IC device assembly 800 may include a number of non-planar transistors having a gate material removed from selected sidewalls in a gate trench, such as disclosed herein.

In some embodiments, the circuit board 802 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 802. In other embodiments, the circuit board 802 may be a non-PCB substrate.

The IC device assembly 800 illustrated in FIG. 8 includes a package-on-interposer structure 836 coupled to the first face 840 of the circuit board 802 by coupling components 816. The coupling components 816 may electrically and mechanically couple the package-on-interposer structure 836 to the circuit board 802, and may include solder balls (as shown in FIG. 8), male and female portions of a socket, an adhesive, an underfill material, and/or any other suitable electrical and/or mechanical coupling structure.

The package-on-interposer structure 836 may include an IC package 820 coupled to an interposer 804 by coupling components 818. The coupling components 818 may take any suitable form for the application, such as the forms discussed above with reference to the coupling components 816. Although a single IC package 820 is shown in FIG. 8, multiple IC packages may be coupled to the interposer 804. It is to be appreciated that additional interposers may be coupled to the interposer 804. The interposer 804 may provide an intervening substrate used to bridge the circuit board 802 and the IC package 820. The IC package 820 may be or include, for example, a die (the die 602 of FIG. 6B), or any other suitable component. Generally, the interposer 804 may spread a connection to a wider pitch or reroute a connection to a different connection. For example, the interposer 804 may couple the IC package 820 (e.g., a die) to a ball grid array (BGA) of the coupling components 816 for coupling to the circuit board 802. In the embodiment illustrated in FIG. 8, the IC package 820 and the circuit board 802 are attached to opposing sides of the interposer 804. In other embodiments, the IC package 820 and the circuit board 802 may be attached to a same side of the interposer 804. In some embodiments, three or more components may be interconnected by way of the interposer 804.

The interposer 804 may be formed of an epoxy resin, a fiberglass-reinforced epoxy resin, a ceramic material, or a polymer material such as polyimide. In some implementations, the interposer 804 may be formed of alternate rigid or flexible materials that may include the same materials described above for use in a semiconductor substrate, such as silicon, germanium, and other group III-V and group IV materials. The interposer 804 may include metal interconnects 810 and vias 808, including but not limited to through-silicon vias (TSVs) 806. The interposer 804 may further include embedded devices, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio-frequency (RF) devices, power amplifiers, power management devices, antennas, arrays, sensors, and microelectromechanical systems (MEMS) devices may also be formed on the interposer 804. The package-on-interposer structure 836 may take the form of any of the package-on-interposer structures known in the art.

The IC device assembly 800 may include an IC package 824 coupled to the first face 840 of the circuit board 802 by coupling components 822. The coupling components 822 may take the form of any of the embodiments discussed above with reference to the coupling components 816, and the IC package 824 may take the form of any of the embodiments discussed above with reference to the IC package 820.

The IC device assembly 800 illustrated in FIG. 8 includes a package-on-package structure 834 coupled to the second face 842 of the circuit board 802 by coupling components 828. The package-on-package structure 834 may include an IC package 826 and an IC package 832 coupled together by coupling components 830 such that the IC package 826 is disposed between the circuit board 802 and the IC package 832. The coupling components 828 and 830 may take the form of any of the embodiments of the coupling components 816 discussed above, and the IC packages 826 and 832 may take the form of any of the embodiments of the IC package 820 discussed above. The package-on-package structure 834 may be configured in accordance with any of the package-on-package structures known in the art.

Figure 9:
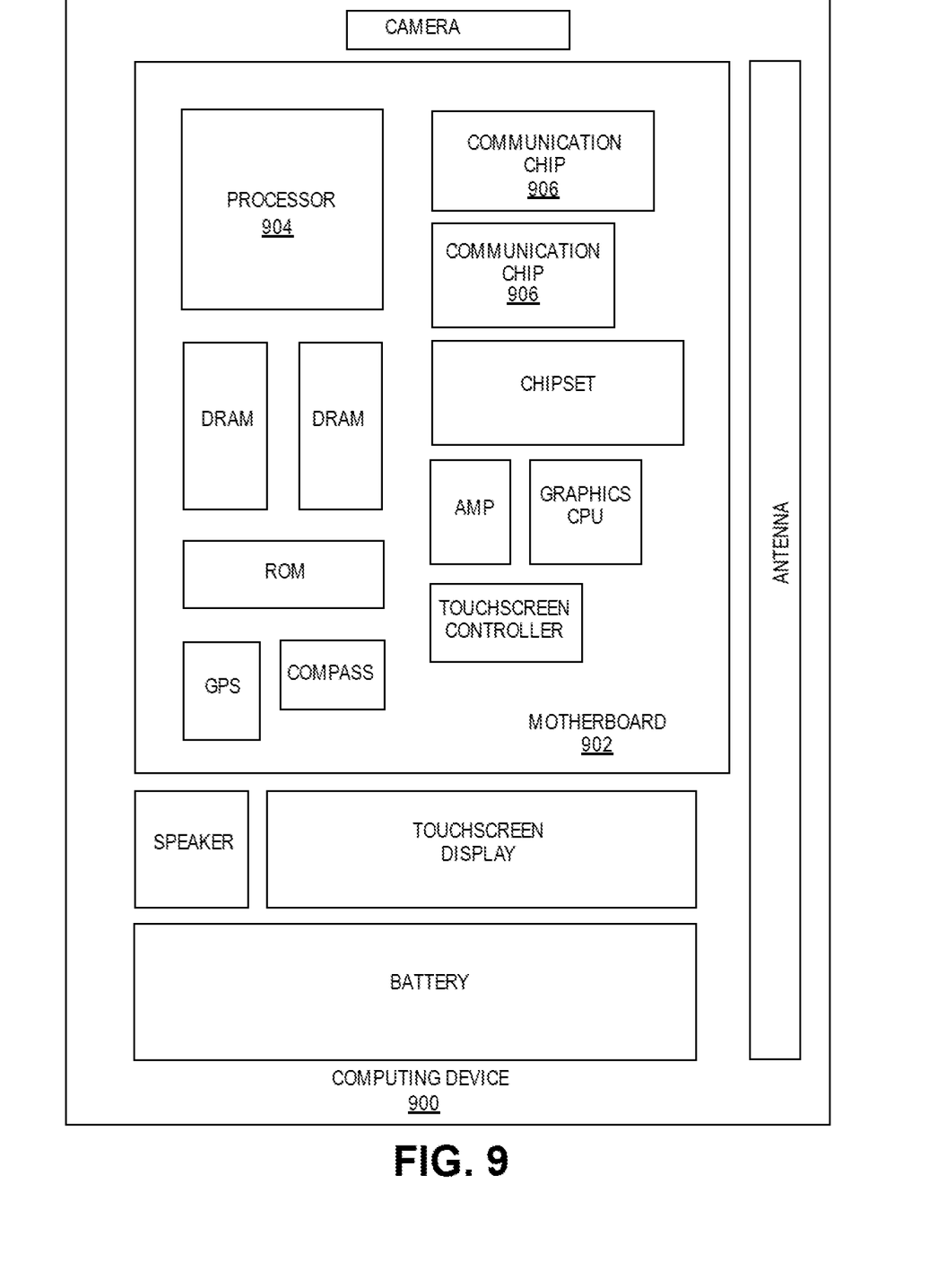
FIG. 9 illustrates a computing device in accordance with one implementation of the disclosure.

FIG. 9 illustrates a computing device 900 in accordance with one implementation of the disclosure. The computing device 900 houses a board 902. The board 902 may include a number of components, including but not limited to a processor 904 and at least one communication chip 906. The processor 904 is physically and electrically coupled to the board 902. In some implementations the at least one communication chip 906 is also physically and electrically coupled to the board 902. In further implementations, the communication chip 906 is part of the processor 904.

Depending on its applications, computing device 900 may include other components that may or may not be physically and electrically coupled to the board 902. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 906 enables wireless communications for the transfer of data to and from the computing device 900. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 906 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 900 may include a plurality of communication chips 906. For instance, a first communication chip 906 may be dedicated to shorter range wireless communications such as Wi-Fi and Bluetooth and a second communication chip 906 may be dedicated to longer range wireless communications such as GPS, EDGE, GPRS, CDMA, WiMAX, LTE, Ev-DO, and others.

The processor 904 of the computing device 900 includes an integrated circuit die packaged within the processor 904. In some implementations of the disclosure, the integrated circuit die of the processor includes one or more non-planar transistors having a gate material removed from selected sidewalls in a gate trench, in accordance with implementations of embodiments of the disclosure. The term "processor" may refer to any device or portion of a device that processes electronic data from registers and/or memory to transform that electronic data into other electronic data that may be stored in registers and/or memory.

The communication chip 906 also includes an integrated circuit die packaged within the communication chip 906. In accordance with another implementation of embodiments of the disclosure, the integrated circuit die of the communication chip includes one or more non-planar transistors having a gate material removed from selected sidewalls in a gate trench, in accordance with implementations of embodiments of the disclosure.

In further implementations, another component housed within the computing device 900 may contain an integrated circuit die that includes one or more non-planar transistors having a gate material removed from selected sidewalls in a gate trench, in accordance with implementations of embodiments of the disclosure.

In various implementations, the computing device 900 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 900 may be any other electronic device that processes data.

Thus, embodiments described herein include non-planar transistors having a gate material removed from selected sidewalls in a gate trench.

The above description of illustrated implementations of embodiments of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

Example embodiment 1: A method of fabricating an integrated circuit structure comprises depositing an oxide insulator layer over a substrate having fins. A gate trench is formed within the oxide insulator layer with the fins extending above a surface of the oxide insulator layer within the gate trench. A semiconducting oxide material is deposited to conformally cover the oxide insulator layer, including on top surfaces and sidewalls of both the gate trench and the fins. A gate material is deposited to conformally cover the semiconducting oxide material, including on top surfaces and sidewalls of both the gate trench and the fins. An angled etch is performed to remove the gate material selective to the semiconducting oxide material from sidewalls of the gate trench, but not from sidewalls of the fins.

Example embodiment 2: The method of example embodiment 1, further comprising using hafnium oxide as the semiconducting oxide material Example embodiment 3: The method of example embodiment 1 or 2, further comprising using titanium nitride as the gate material.

Example embodiment 4: The method of example embodiment 1, 2 or 3, further comprising performing the angled etch using an lateral RIE chamber.

Example embodiment 5: The method of example embodiment 4, further comprising using a halogen gas in the lateral RIE chamber.

Example embodiment 6: The method of example embodiment 4 or 5, further comprising using chlorine and argon in the lateral RIE chamber.

Example embodiment 7: The method of example embodiment 4, 5 or 6, further comprising using the lateral RIE chamber to generate a ribbon beam.

Example embodiment 8: The method of example embodiment 7, further comprising selecting a directional component of the ribbon beam by selecting parameters of the ion-beam chamber, the parameters including: a choice of optics, a distance between the wafer and the beam, a choice of gases and chemistries, and an extraction voltage Example embodiment 9: The method of example embodiment 1, 2, 3, 4, 5, 6, 7 or 8, further comprising performing a replacement gate process to replace the gate material with a permanent gate electrode material.

Example embodiment 10: The method of example embodiment 1, 2, 3, 4, 5, 6, 7, 8 or 9, further comprising forming the fins with a width of approximately 14 nm and a pitch of the approximately 40-90 nm.

Example embodiment 11: A method of fabricating a non-planar integrated circuit structure, the non-planar integrated circuit structure comprising an oxide insulator layer over a substrate having fins, and a gate trench within the oxide insulator layer with the fins extending above a surface of the oxide insulator layer within the gate trench. The method comprises forming a semiconducting oxide material comprising hafnium oxide to conformally cover the oxide insulator layer, including on top surfaces and sidewalls of both the gate trench and the fins. A gate material comprising titanium nitride is formed to conformally cover the semiconducting oxide material, including on top surfaces and sidewalls of both the gate trench and the fins. An angled etch is performed to remove the gate material selective to the semiconducting oxide material from sidewalls of the gate trench, but not from sidewalls of the fins.

Example embodiment 12: The method of example embodiment 11, further comprising performing the angled etch using an lateral RIE chamber.

Example embodiment 13: The method of example embodiment 12, further comprising using a halogen gas in the lateral RIE chamber.

Example embodiment 14: The method of example embodiment 12 or 13, further comprising using chlorine and argon in the lateral RIE chamber.

Example embodiment 15: The method of example embodiment 12, 13 or 14, further comprising using a dry etch cluster tool that generates a ribbon beam.

Example embodiment 16: The method of example embodiment 15, further comprising selecting a directional component of the ribbon beam by selecting parameters of the ion-beam chamber, the parameters including: a choice of optics, a distance between the wafer and the beam, a choice of gases and chemistries, and an extraction voltage.

Example embodiment 17: The method of example embodiment 11, 12, 13, 14, 15 or 16 further comprising performing a replacement gate process to replace the gate material with a permanent gate electrode material.

Example embodiment 18: The method of example embodiment 11, 12, 13, 14, 15, 16 or 17 further comprising forming the fins with a width of approximately 14 nm and a pitch of the approximately 40-90 nm.

Example embodiment 19: An integrated circuit structure comprises an oxide insulator layer over a substrate, the oxide insulator layer having a gate trench therein. Fins extend above the oxide insulator layer within the gate trench, wherein the fins have a top and sidewalls. A semiconducting oxide material comprising hafnium oxide conformally covers the oxide insulator layer, including on the top and sidewalls of both the gate trench and the fins. A gate material comprising titanium nitride covers sidewalls of the fins over the semiconducting oxide material, but not any other horizontal or vertical surface in the gate trench.

Example embodiment 20: The integrated circuit of example embodiment 19, wherein the fins have a pitch of approximately 40-90 nm and are approximately 14 nm in width, wherein the semiconducting oxide material is approximately 1 nm in thickness on horizontal and vertical surfaces of both the oxide insulator layer and the fins, and wherein approximately 3-4 nm of the gate material is along the sidewalls of the fins.

What is claimed is:

1. A method of fabricating an integrated circuit structure, comprising:
   depositing an oxide insulator layer over a substrate having fins;
   forming a gate trench within the oxide insulator layer with the fins extending above a surface of the oxide insulator layer within the gate trench;
   depositing semiconducting oxide material to conformally cover the oxide insulator layer, including on top surfaces and sidewalls of both the gate trench and the fins;
   depositing a gate material to conformally cover the semiconducting oxide material, including on top surfaces and sidewalls of both the gate trench and the fins; and
   performing an angled etch to remove the gate material selective to the semiconducting oxide material from sidewalls of the gate trench, but not from sidewalls of the fins.

2. The method of claim 1, further comprising using hafnium oxide as the semiconducting oxide material.

3. The method of claim 1, further comprising using titanium nitride as the gate material.

4. The method of claim 1, further comprising performing a replacement gate process to replace the gate material with a permanent gate electrode material.

5. The method of claim 1, further comprising forming the fins with a width of approximately 14 nm and a pitch of approximately 40-90 nm.

6. The method of claim 1, further comprising performing the angled etch using a lateral reactive ion etch (RIE) chamber.

7. The method of claim 6, further comprising using a halogen gas in the lateral RIE chamber.

8. The method of claim 6, further comprising using halogen and argon in the lateral RIE chamber.

9. The method of claim 6, further comprising using the lateral RIE chamber to generate a ribbon beam.

10. The method of claim 9, further comprising selecting a directional component of the ribbon beam by selecting parameters of the lateral RIE chamber, the parameters including: a choice of optics, a distance between a wafer and the ribbon beam, a choice of gases and chemistries, and an extraction voltage.

11. A method of fabricating a non-planar integrated circuit structure, the non-planar integrated circuit structure comprising an oxide insulator layer over a substrate having fins, and a gate trench within the oxide insulator layer with the fins extending above a surface of the oxide insulator layer within the gate trench, the method comprising:

forming a semiconducting oxide material comprising hafnium oxide to conformally cover the oxide insulator layer, including on top surfaces and sidewalls of both the gate trench and the fins;

forming a gate material comprising titanium nitride to conformally cover the semiconducting oxide material, including on top surfaces and sidewalls of both the gate trench and the fins; and forming an angled etch to remove the gate material selective to the semiconducting oxide material from sidewalls of the gate trench, but not from sidewalls of the fins.

12. The method of claim 11, further comprising performing a replacement gate process to replace the gate material with a permanent gate electrode material.

13. The method of claim 11, further comprising forming the fins with a width of approximately 14 nm and a pitch of approximately 40-90 nm.

14. The method of claim 11, further comprising performing the angled etch using a lateral reactive ion etch (RIE) chamber.

15. The method of claim 14, further comprising using a halogen gas in the lateral RIE chamber.

16. The method of claim 14, further comprising using chlorine and argon in the lateral RIE chamber.

17. The method of claim 14, further comprising using the lateral RIE chamber to generate a ribbon beam.

18. The method of claim 17, further comprising selecting a directional component of the ribbon beam by selecting parameters of the lateral RIE chamber, the parameters including: a choice of optics, a distance between a wafer and the ribbon beam, a choice of gases and chemistries, and an extraction voltage.

19. An integrated circuit structure comprising:

an oxide insulator layer over a substrate, the oxide insulator layer having a gate trench therein;

fins extending above the oxide insulator layer within the gate trench, wherein the fins have a top and sidewalls;

a semiconducting oxide material comprising hafnium oxide conformally covering the oxide insulator layer, including on the top and sidewalls of both the gate trench and the fins;

a gate material comprising titanium nitride covering sidewalls of the fins over the semiconducting oxide material, but not any other horizontal or vertical surface in the gate trench.

20. The integrated circuit structure of claim 19 wherein the fins have a pitch of approximately 40-90 nm and are approximately 14 nm in width, wherein the semiconducting oxide material is approximately 1 nm in thickness on horizontal and vertical surfaces of both the oxide insulator layer and the fins, and wherein approximately 3-4 nm of the gate material is along the sidewalls of the fins.

* * * * *